United States Patent
Nishimoto et al.

(10) Patent No.: US 8,078,310 B2
(45) Date of Patent: Dec. 13, 2011

(54) COMPONENT CRIMPING APPARATUS CONTROL METHOD, COMPONENT CRIMPING APPARATUS, AND MEASURING TOOL

(75) Inventors: Tomotaka Nishimoto, Osaka (JP); Yasuhiro Okada, Osaka (JP); Chihiro Igarashi, Osaka (JP); Takanori Yoshitake, Saga (JP); Nobuhisa Watanabe, Osaka (JP)

(73) Assignee: Panasonic Corporation, Osaka (JP)

( * ) Notice: Subject to any disclaimer, the term of this patent is extended or adjusted under 35 U.S.C. 154(b) by 386 days.

(21) Appl. No.: 12/440,776

(22) PCT Filed: Sep. 25, 2007

(86) PCT No.: PCT/JP2007/069153
§ 371 (c)(1),
(2), (4) Date: Mar. 11, 2009

(87) PCT Pub. No.: WO2008/044514
PCT Pub. Date: Apr. 17, 2008

(65) Prior Publication Data
US 2009/0288462 A1    Nov. 26, 2009

(30) Foreign Application Priority Data
Oct. 2, 2006   (JP) ................................ 2006-271055

(51) Int. Cl.
*G06F 19/00*   (2011.01)
*D02G 1/00*   (2006.01)
*D01D 10/00*   (2006.01)

(52) U.S. Cl. ............... 700/206; 28/218; 28/247; 28/286

(58) Field of Classification Search .................. 700/206; 28/247, 218, 286
See application file for complete search history.

(56) References Cited

U.S. PATENT DOCUMENTS
3,537,137 A * 11/1970 Lancesseur .................. 425/350
(Continued)

FOREIGN PATENT DOCUMENTS
DE        42 02 481        8/1993
(Continued)

OTHER PUBLICATIONS

International Search Report issued Jan. 30, 2008 in the International (PCT) Application of which the present application is the U.S. National Stage, pct/jp2007/069153, p. 5.

(Continued)

*Primary Examiner* — Albert Decady
*Assistant Examiner* — Thomas Stevens
(74) *Attorney, Agent, or Firm* — Wenderoth, Lind & Ponack, L.L.P.

(57) ABSTRACT

A component crimping apparatus control method which enables a measuring tool to directly measure a temperature of a part pressed by a pressing head. The component crimping apparatus control method is applied to a component crimping apparatus which crimps a component onto a plate-shaped workpiece, and causes a measuring tool shaped identically as the workpiece to measure a temperature or a pressure of a pressed part in a pressing process of pressing a component onto the workpiece using a heated pressing head. The method includes acquiring information indicating whether or not the measuring tool is held in the component crimping apparatus, and, in the case where the information indicating that the measuring tool is held is acquired, positioning the measuring tool identically as the workpiece, and executing the pressing process on the component to be attached to the measuring tool after the positioning.

12 Claims, 10 Drawing Sheets

U.S. PATENT DOCUMENTS

| | | | | |
|---|---|---|---|---|
| 4,295,252 A | * | 10/1981 | Robinson et al. | 28/248 |
| 4,659,872 A | * | 4/1987 | Dery et al. | 174/117 A |
| 5,307,678 A | * | 5/1994 | Cost | 73/304 C |
| 6,161,407 A | | 12/2000 | Meisser | 72/21.4 |
| 6,212,924 B1 | * | 4/2001 | Meisser | 72/21.4 |
| 6,776,859 B1 | | 8/2004 | Burke | |
| 6,796,711 B2 | * | 9/2004 | Colson et al. | 374/179 |
| 2004/0263712 A1 | * | 12/2004 | Yamazaki et al. | 349/45 |

FOREIGN PATENT DOCUMENTS

| | | |
|---|---|---|
| JP | 3-210530 | 9/1991 |
| JP | 5-291353 | 11/1993 |
| JP | 2000-124232 | 4/2000 |
| JP | 2002-022549 | 1/2002 |
| JP | 2003059973 * | 2/2003 |
| JP | 2005-085914 | 3/2005 |
| JP | 2006-228780 | 8/2006 |

OTHER PUBLICATIONS

Written Opinion of the International Searching Authority issued Jan. 30, 2008 in the International (PCT) Application of which the present application is the U.S. National Stage (in English).

* cited by examiner

COMPONENT CRIMPING APPARATUS CONTROL METHOD, COMPONENT CRIMPING APPARATUS, AND MEASURING TOOL

TECHNICAL FIELD

The present invention relates to a component crimping apparatus control method or the like that is applied to a component crimping apparatus which crimps a component onto a plate-shaped workpiece, for causing a measuring tool shaped identically to the workpiece to measure temperature or pressure of a pressed part in a pressing process of pressing the component onto the workpiece using a heated pressing head.

BACKGROUND ART

In recent years, semiconductor elements and flexible boards such as a TAB (Tape Automated Bonding) board are attached onto rims of a flat panel serving as the base plate for a LCD (liquid crystal display), a PDP (plasma display panel), and so on which have become popularized.

To industrially attach semiconductor elements and so on to the flat panel, the following procedures are performed.

(1) Anisotropic conductive adhesive in the form of tape (hereinafter, described as "ACF tape") is crimped onto the rims of a flat panel by being pressed using a heated pressing head. The crimping is performed by an ACF crimping apparatus.

(2) An electronic component is placed on the pressed ACF tape, and the electronic component is temporarily crimped by pressing the electronic component using the heated pressing head. The temporary crimping is performed by a temporary crimping apparatus.

(3) In order to ensure the conduction between the temporarily crimped electronic component and an electrode provided on the flat panel, the temporarily crimped electronic component is permanently crimped by being pressed by the heated pressing head. The permanent crimping is performed by a permanent crimping apparatus.

Since the temperature state and the pressure state in the crimping process influence the connection state and the conduction state between the flat panel and the component, a technology is disclosed for stably securing the connection state and the conduction state by arbitrarily controlling a heating temperature profile or a pressure profile of the pressing head at the time of crimping. (For example, Japanese Unexamined Patent Application No. H03-210530)

DISCLOSURE OF INVENTION

Problems that Invention is to Solve

However, in monitoring the temperature and the pressure at the time of pressing, only the temperature of the pressing head and air pressure to be introduced into an air cylinder are monitored. The arbitrarily set profile is for the temperature and pressure of the pressing head at the time of pressing, and not the actual pressure received by the ACF tape or the temperature of the ACF tape per se. In other words, it is not possible, in the above method, to directly judge whether or not the ACF tape has attained the temperature range and the pressure state recommended by the ACF tape manufacturer. There is no choice but to check the connection state and the conduction state between the flat panel and the component after completion of the crimping process, and infer by analogy whether or not the temperature of the ACF tape has been heated and pressed to an appropriate state.

In addition, when industrially manufacturing the flat panel display, each crimping process is sequentially performed onto a large volume of flat panels on an assembly line, and the connection state and the conduction state are checked in an inspection process further downstream.

Therefore, when any defect is found in the inspection process, all the flat panels existing from the crimping process to the inspection process become defective products. Thus, a large volume of defective products are generated due to the trouble with the crimping apparatus and influence costs.

The present invention is conceived in view of the above problems, and has as an object to provide a component crimping apparatus control method for enabling direct measurement of the temperature and the pressure of the part pressed by the pressing head.

Means to Solve the Problems

In order to achieve the above object, the component crimping apparatus control method according to the present invention is a component crimping apparatus control method for controlling a crimping apparatus in order to cause a measuring tool to measure a temperature or a pressure of a pressed part in a pressing process of pressing a component onto a plate-shaped workpiece, using a heated pressing head in the component crimping apparatus which crimps the component onto the workpiece, the measuring tool being a measuring board which is shaped identically as the workpiece and to which a component and a temperature probe or a pressure probe are attached, the method includes: acquiring information indicating whether or not the measuring tool is held in the component crimping apparatus; positioning the measuring tool identically as the workpiece in the case where the information indicating that the measuring tool is held is acquired; and executing the pressing process on the component to be provided to the measuring tool, after the positioning.

Accordingly, it is possible to position the measuring tool identically as a workpiece, perform the pressing process, and directly measure the temperature or pressure of the pressed part. Thus, errors in temperature measurement or pressure measurement due to misalignment are eliminated, and the accurate and real-time measurement of the temperature or the pressure of the pressed part becomes possible.

Furthermore, it is also possible that the component crimping apparatus control method further includes changing a mode of the component crimping apparatus into a temperature measurement support mode or a pressure measurement support mode in the case where the information indicating that the measuring tool is held is acquired, the temperature measurement support mode or the pressure measurement support mode being a state for causing the measuring tool to measure the temperature or the pressure, respectively.

Furthermore, it is also possible that in the temperature measurement support mode or the pressure measurement support mode, the component to be crimped onto the workpiece is not supplied to the measuring tool.

Accordingly, it is possible to avoid trouble such as having the component crimping apparatus further perform temporary crimping of a component onto the measuring tool, and the temperature state or the pressure state of an arbitrary part can be accurately measured.

Furthermore, it is also possible that in the acquiring of information indicating whether or not the measuring tool is held, information about a type of the measuring tool is acquired, and the method further includes skipping the positioning and the executing in the case where the acquired information about the type of the measuring tool and the component crimping apparatus do not match.

Accordingly, it is possible to selectively measure only the temperature or the pressure of the pressed part in the target crimping process. In particular, this effect is most obvious in the case where the measuring tool is introduced in-line in the same manner as with the workpiece.

Furthermore, it is also possible that the component crimping apparatus control method further includes notifying information prompting performance of an operation related to temperature measurement or pressure measurement before a start of the executing.

Accordingly, it is possible, in the case where the information regarding the temperature or information regarding the pressure needs to be acquired manually from the measuring tool, to notify an operator accordingly, and thus the operator's waiting time can be shortened, and operating efficiency can be improved.

Furthermore, it is also possible that the component crimping apparatus control method further includes acquiring information regarding temperature or pressure from the measuring tool.

Accordingly, feedback control becomes possible using the information regarding the temperature or the information regarding the pressure. Furthermore, it is possible to accumulate the information regarding the temperature and know, in advance, the tendency for the occurrence of trouble.

Note that the above object can also be achieved with a component crimping apparatus which includes, as units, each of the above-mentioned steps, and the same effect as that described above can be produced.

Moreover, the above object can also be achieved with a program which causes a computer to execute the above-mentioned steps, and the same effect as that described above can be produced.

Furthermore, in order to achieve the above object, the measuring tool is a measuring tool applied to a component crimping apparatus that crimps a component onto a plate-shaped workpiece, and which measures a temperature of a pressed part in a pressing process of pressing the component onto the workpiece using a pressing head in a heated state included in the component crimping apparatus, the measuring tool includes: a board shaped identically as the workpiece; a component to be provided to the board in an identical position as the workpiece; and a temperature probe or a pressure probe arranged so as to be in contact with the workpiece.

Accordingly, the component crimping apparatus control method can be reliably implemented.

Effects of the Invention

The present invention enables accurate and real-time measurement of temperature of a part pressed by a pressing head included in a component crimping apparatus.

Further Information about Technical Background to this Application

The disclosure of Japanese Patent Application No. 2006-271055 filed on Oct. 2, 2006 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings.

BEST MODE FOR CARRYING OUT THE INVENTION

Next, a component crimping apparatus control method and so on according to the present invention will be described with an example of an in-line mounter in which plural kinds of component crimping apparatuses are combined.

First Embodiment

Figure 1:
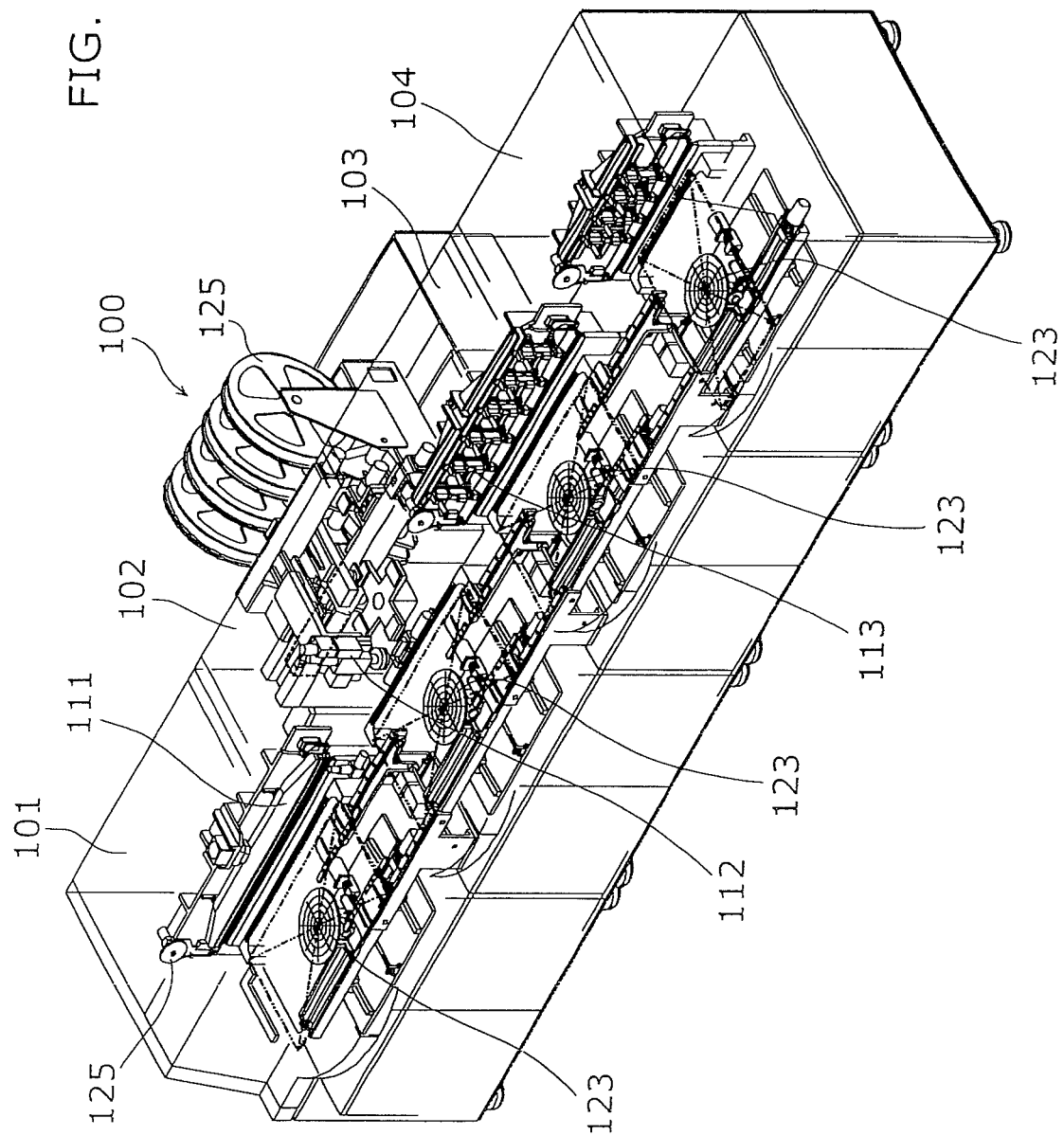
FIG. 1 is a perspective view showing an in-line mounter.

FIG. 1 is a perspective view showing an in-line mounter.

Figure 2:
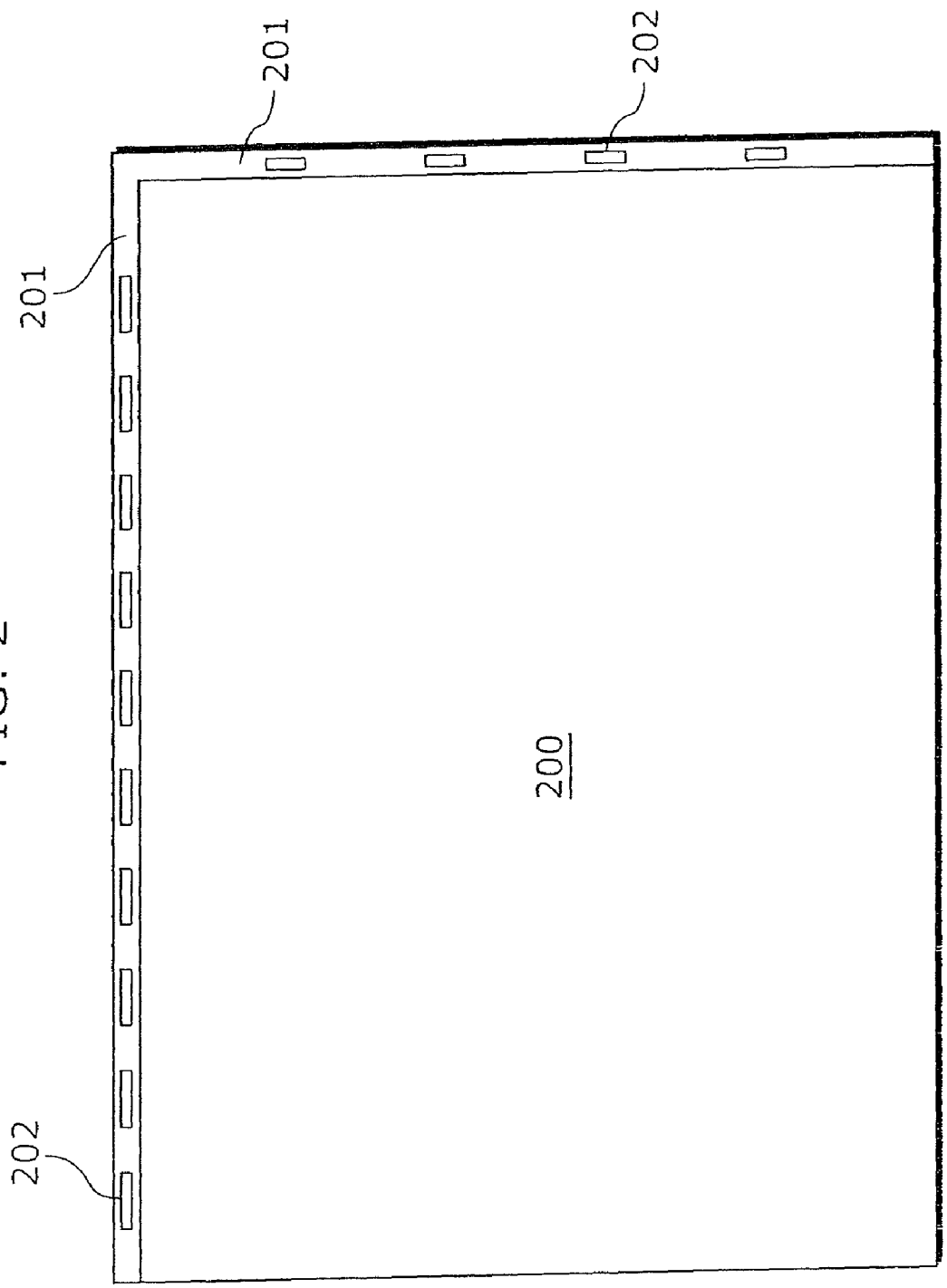
FIG. 2 is a plan view showing a glass board after being mounted with the component.

As shown in the figure, an in-line mounter 100 is an apparatus which mounts an electronic component 202 as a component onto two continuous rims of a glass board 200 for a flat panel display as shown in FIG. 2, and includes each of the following crimping apparatuses in-line, from upstream: an ACF crimping apparatus 101; a temporary crimping apparatus 102; a lateral permanent crimping apparatus 103; and a longitudinal permanent crimping apparatus 104.

The ACF crimping apparatus 101 is an apparatus which crimps ACF tape 201 as a component onto the rims of the glass board 200 as a workpiece, and includes an ACF pressing head 111 which presses the ACF tape 201 onto the glass board 200 in a heated state.

The ACF pressing head 111 has sufficient length for pressing the ACF tape 201 over the entire longitudinal direction of the glass board 200. Therefore, the heat capacity of the ACF pressing head 111 is greater as compared to the other pressing heads.

The temporary crimping apparatus 102 is an apparatus which crimps the electronic component 202 onto the ACF tape 201, which has been crimped onto the glass board 200 by the ACF crimping apparatus 101 located upstream, and includes a temporary pressing head 112 which places and presses the electronic component 202 onto the ACF tape 201 in a heated state.

The lateral permanent crimping apparatus 103 is an apparatus which crimps the electronic component 202, which has been temporarily crimped by the temporary crimping apparatus 102 located upstream, so as to be conductive with an electrode provided on the glass board 200, and includes a lateral permanent pressing head 113 which presses the electronic component 202 in a heated state. Note that in the present embodiment the lateral permanent crimping apparatus includes a corresponding number of the lateral permanent pressing heads 113 as the number of the electronic components 202 to be temporarily crimped.

The longitudinal permanent crimping apparatus 104 includes a longitudinal permanent pressing head 114. Since other structures are nearly the same as the lateral permanent crimping apparatus 103, description will be omitted.

Here, the ACF tape 201 can produce a predetermined adhesive force by having predetermined pressure applied while heated to a predetermined temperature. Furthermore, with the ACF tape 201, when the predetermined pressure is applied in a thickness direction while being heated to the predetermined temperature, conductivity is generated in the pressed part in the thickness direction. In the case where there are plural points on which the pressure is applied, the pressed points remain insulated from each other, that is, no conductivity is generated along the width direction or in the length direction.

Figure 3:
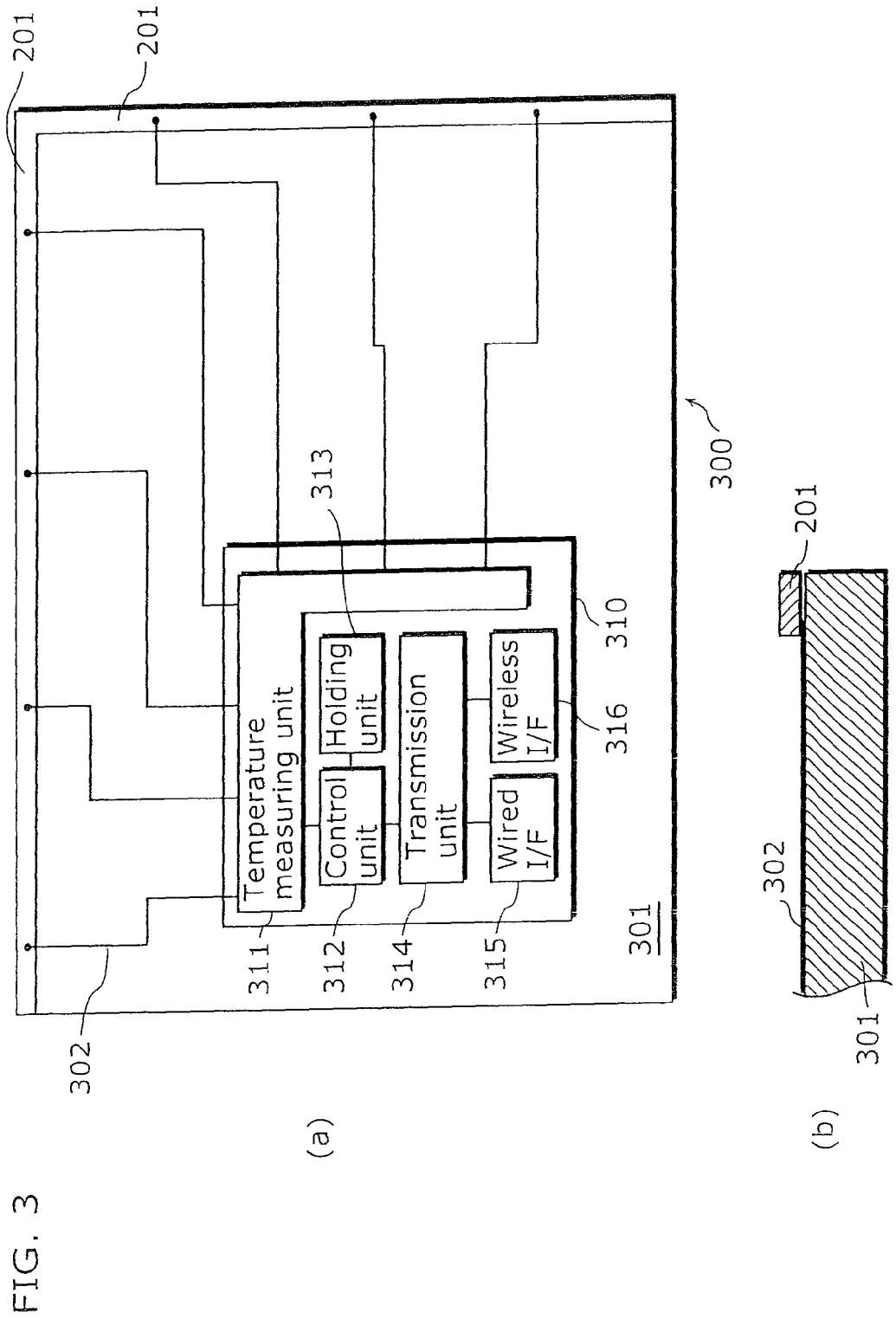
FIG. 3 is a diagram schematically showing a measuring tool: (a) is a plan view and (b) is a cross-sectional view as showing close-up the part of which temperature is measured.

FIG. 3 is a diagram schematically showing a measuring tool; (a) is a plan view and (b) is a cross-sectional view showing, close-up, the part of which temperature is measured.

The measuring tool 300 as shown in FIG. 3 is a tool which measures the temperature of the pressed part when pressed by the ACF pressing head 111 in the ACF crimping apparatus 101. The measuring tool 300 includes: a measuring board 301 shaped identically to the glass board 200: a thermocouple 302 as a temperature probe; a measuring apparatus 310 which processes information from the thermocouple 302; and the ACF tape 201. Note that the measuring tool 300, including the thermocouple 302 and the measuring apparatus 310, is identically shaped as the glass board 200.

As described earlier, the measuring board 301 has an identical thickness and an identical rectangular shape as the glass board 200. In the present embodiment, a glass board 200 which is a workpiece is actually used as a measuring board 301. In addition, a barcode (not shown) is attached to the measuring board 301 as with the glass board 200 which is the workpiece. The barcode contains identification information for identifying each individual measuring tool 300 and also identifying the measuring tool from the workpiece. Note that other than the barcode, it is possible to use a two-dimensional barcode (QR code (trademark)), an IC tag, and so on, as a method of allowing the identification information about the measuring tool 300 to be carried by the measuring tool 300 itself.

Furthermore, the measuring board 301 is given a mark (not shown) for positioning it in the same manner as with the glass board 200 which is the workpiece.

The thermocouple 302 is a sensor which outputs the temperature at its tip as an electrical signal and as shown in (b) in the same diagram, its tip is fixed so as to be sandwiched between the measuring board 301 and the ACF tape 201. In addition, the thermocouple 302 is placed at plural points so as to be able to measure the temperature of the plural points.

The measuring apparatus 310 is an apparatus which processes the electrical signal outputted from the thermocouple 302, and includes a temperature measuring unit 311, a control unit 312, a holding unit 311, a transmission unit 314, a wired I/F 315, and a wireless I/F 316.

The temperature measuring unit 311 is a unit which converts the electrical signal outputted by the thermocouple 302 into measurement information and associates identification information for identifying each thermocouple 302 to respective measurement information. In addition, the measurement information and the associated identification information are transmitted to the control unit.

The control unit 312 is an apparatus which controls each unit included in the measuring apparatus 310, and which transmits the received measurement information and identification information to the holding unit 313 to be hereinafter described, and transmits the measurement information and identification information held in the holding unit 313, to the transmission unit 314 to be hereinafter described.

The holding unit 313 is an apparatus which holds the measurement information and the identification information associated thereto. In addition, in the present embodiment, time information is generated by the control unit 312, and the holding unit 313 also has a function to chronologically hold the measurement information and identification information based on the time information.

The transmission unit 314 is an apparatus which processes the measurement information and identification information so that they may be transmittable according to a predetermined protocol. In addition, when required, the time information is identically processed.

The wired I/F 315 is an interface for allowing wired connection to other equipment which receives the information transmitted from the transmission unit 314.

The wireless I/F 316 is an interface for allowing wireless connection to other equipment which receives the information transmitted from the transmission unit 314. For the wireless connection, radio waves or light (infrared light) can be given as an example.

Note that although each of the above-mentioned units is described as an apparatus, it is also possible to realize such functions as software.

In addition, the wired I/F 315 and the wireless I/F 316 need not be included at the same time, and having one of either is also acceptable.

Figure 4:
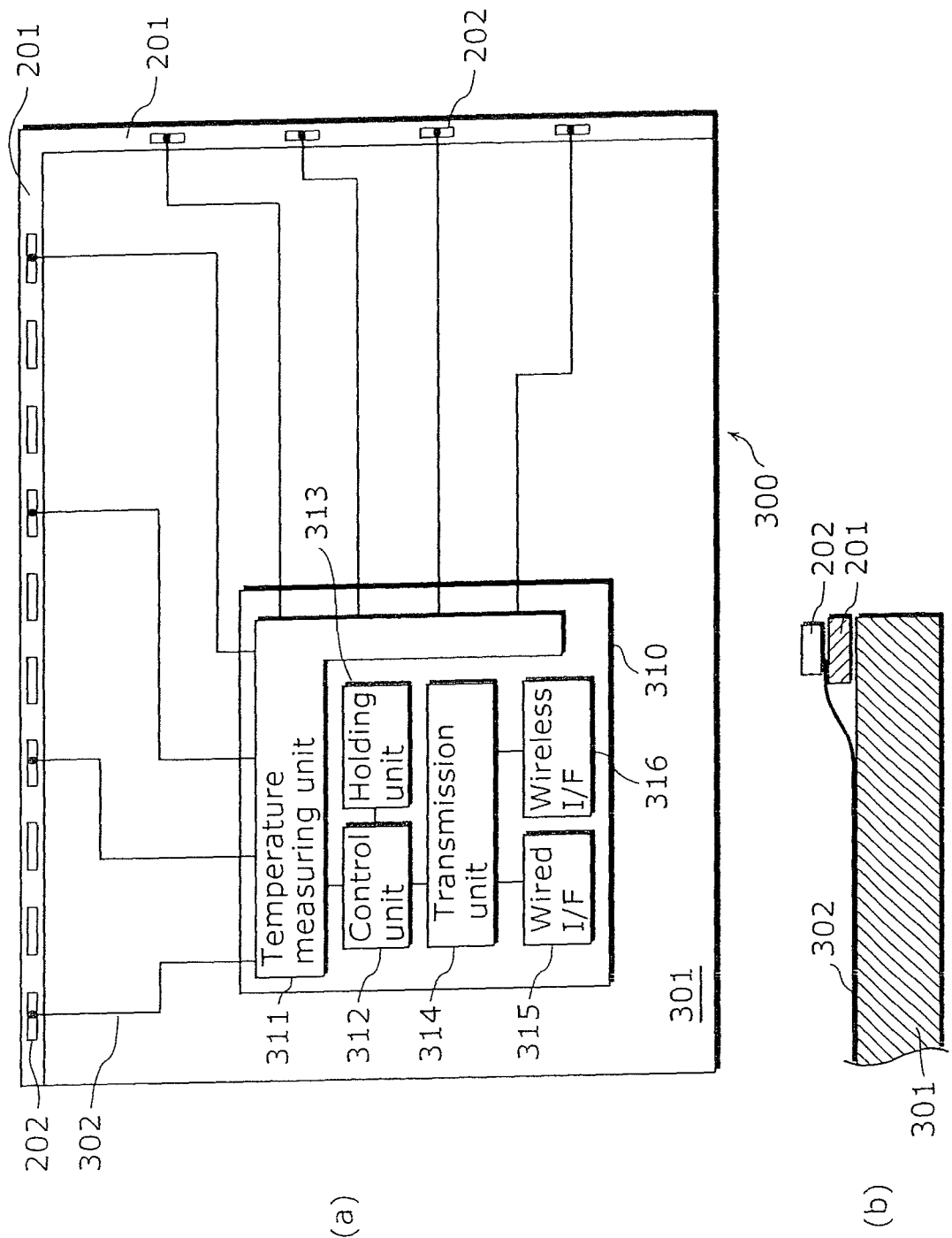
FIG. 4 is a diagram schematically showing another measuring tool: (a) is a plan view and (b) is a cross-sectional view, showing, close-up, the part of which temperature is measured.

FIG. 4 is a diagram schematically showing another measuring tool: (a) is a plan view and (b) is a cross-sectional view showing close-up the part of which temperature is measured.

The measuring tool 300 as shown in the figure is a measuring tool which can be commonly used for the temporary crimping apparatus 101, the lateral permanent crimping apparatus 103, and the longitudinal permanent crimping apparatus 104, and is an instrument for measuring the temperature of the pressed part at the time of pressing by the temporary pressing head 112, the lateral permanent pressing head 113, and the longitudinal permanent pressing head 114. Furthermore, as with the previously mentioned measuring tool 300, this measuring tool 300 includes a measuring board 301, plural thermocouples 302, a measuring apparatus 310, and an ACF tape 201, and is also attached with an electronic component 202, which is identical to the electronic component to be mounted onto the glass board 200.

In addition, as shown in (b) in the same diagram, the thermocouple 302 is fixed so as to be sandwiched between the ACF tape 201 attached to the measuring board 301 and the electronic component 202.

Since other structures are the same as in the previously mentioned measuring tool 300, description will be omitted.

Figure 5:
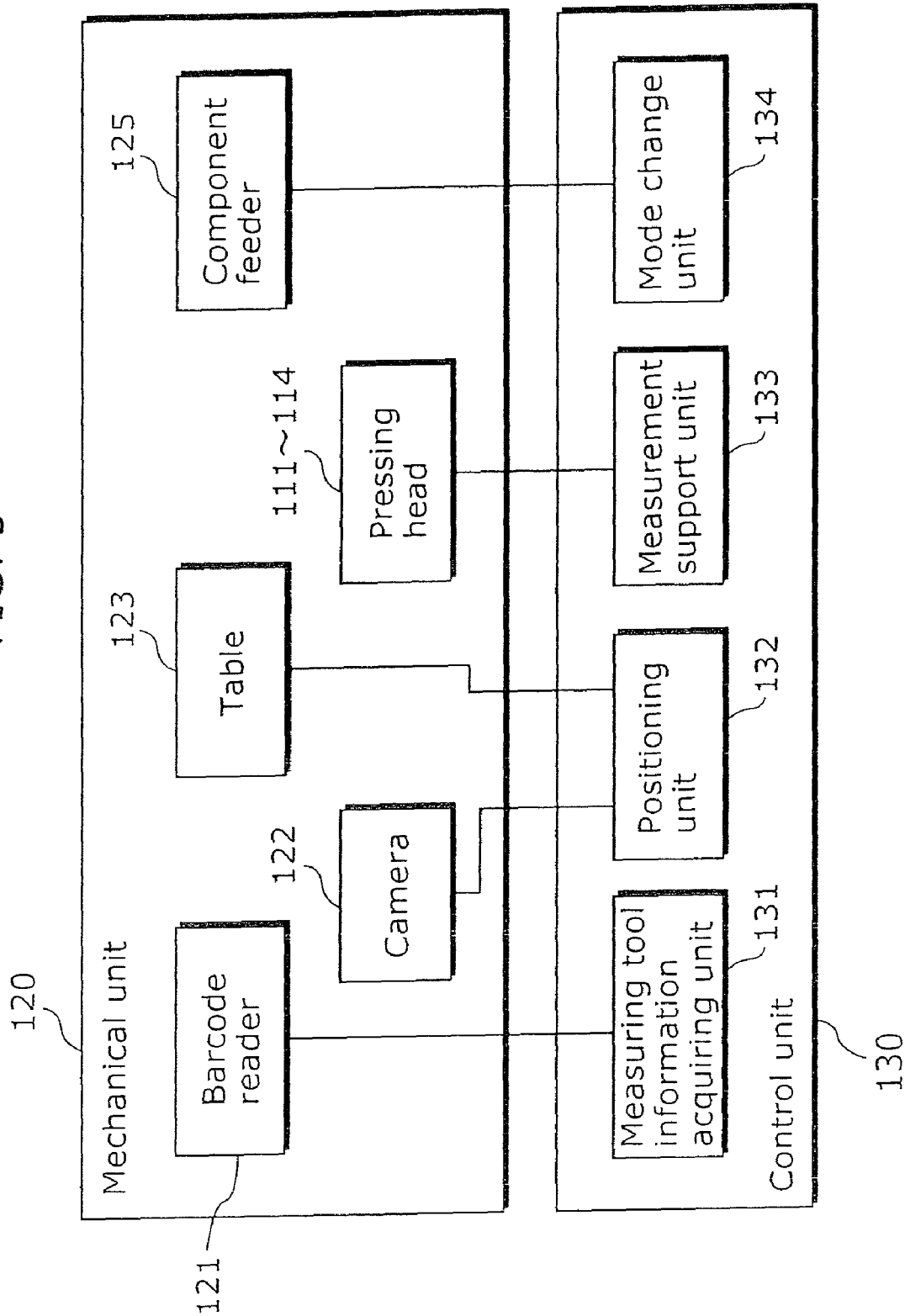
FIG. 5 is a block diagram showing the mechanism and functional structure of the in-line mounter.

FIG. 5 is a block diagram showing the mechanism and functional structure of the in-line mounter 100.

As shown in the figure, aside from the apparatus structure mentioned earlier, the in-line mounter 100 includes: a control unit 130 implemented by a computer based on software, and a mechanism unit 120 which is controlled by the control unit 130 and which provides information to the control unit 130.

A measuring tool information acquiring unit 131 in the control unit 130 is a processing unit which judges whether or not the measuring tool is held, for example, by acquiring information from a barcode reader 121 in the mechanism unit 120. Specifically, to describe this using the ACF tape crimping apparatus 101 as an example, when the measuring tool 300 is carried into the ACF tape crimping apparatus 101, the barcode reader 121 included in the ACF tape crimping apparatus 101 reads the barcode attached to the measuring tool 300, and the measuring tool information acquiring unit 131 judges whether or not the ACF tape crimping apparatus 101 holds the measuring tool 300.

Note that the same judgment is performed in the temporary crimping apparatus 102, and permanent crimping apparatuses 103 and 104.

In addition, instead of directly acquiring the information regarding the presence/absence of the measuring tool 300, it is possible to predetermine the number of the glass boards 200 to be processed before processing the measuring tool 300 and count the number of processed glass boards 200 to judge the presence/absence of the measuring tool 300. In addition, it is also possible to acquire the information through manual input.

The positioning unit 132 is a processing unit which positions the measuring tool 300 by, for example, controlling a table 123 which can move the measuring tool 300 in an X-direction, a Y-direction, and a θ-direction based on information from a camera 122. Specifically, the camera 122 takes an image of a mark put on the measuring tool 300 on the table 123. Based on the obtained image information, the positioning unit 132 calculates the amount of misalignment from the position at which the measuring tool 300 should be located (identically as the glass board 200 as the workpiece), and positions the measuring tool 300 by controlling the table 123 based on the amount of misalignment.

The mode change unit 134 is a processing unit which changes the process to a process different from the process being performed on the glass board 200 as the workpiece, when the measuring tool information acquiring unit 131 acquires the information that the measuring tool 300 is held. Specifically, when the measuring tool 300 is held in the ACF crimping apparatus 101, the mode change unit 134 changes the mounting condition of the in-line mounter 100 so that the process of applying the ACF tape to the glass board 200, for example, a process of drawing out and arranging new ACF tape 201 onto the rim of the glass board 200, will not be performed.

Figure 6:
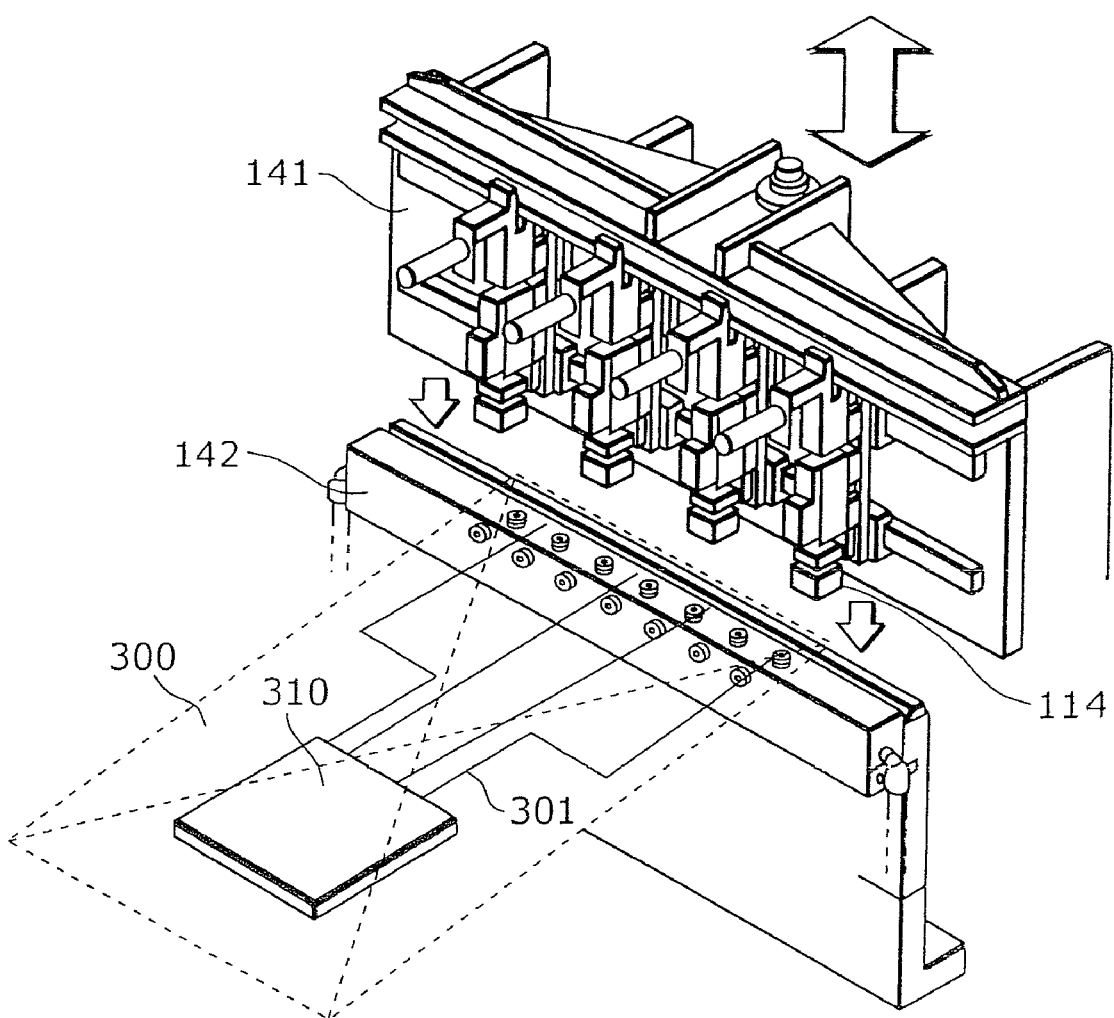
FIG. 6 is a perspective view showing in detail the vicinity of pressing head.

A measurement support unit 133 is a processing unit which controls the pressing heads (111 to 114) and operates the pressing heads (111 to 114) in the same manner as with the glass board 200 as the workpiece. Specifically, for example, as shown in the FIG. 6, when the measuring tool 300 is held in the longitudinal crimping apparatus 104, the measurement support unit 133 performs controlling so as to cause a vertical movement unit 141 to descend to a predetermined position, and cause the lateral permanent pressing head 114 to press the required part.

Next, out of the crimping apparatuses included in the in-line mounter 100, the control operation for the ACF crimping apparatus 101 will be described.

Figure 7:
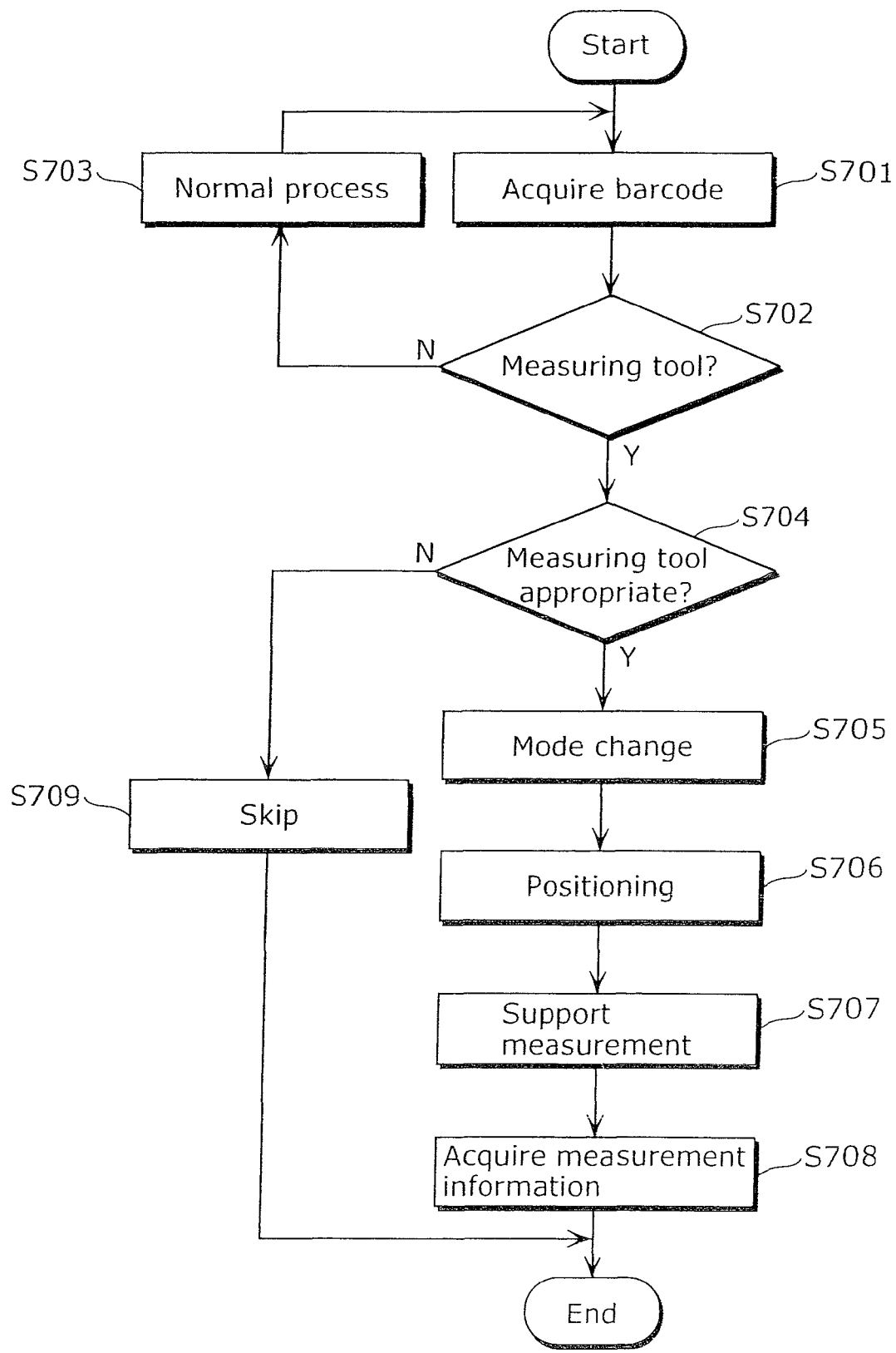
FIG. 7 is a flowchart showing the control operation of the in-line mounter according to the first embodiment.

FIG. 7 is a flowchart showing temperature measurement or pressure measurement support processing operation by the in-line mounter.

As shown in the figure, first, the measuring tool information acquiring unit 131 acquires barcode information from the barcode reader 121 (S701), judges whether or not the measuring tool 300 has been carried into the ACF crimping apparatus 101 (S702), and when it is judged that the glass board 200, as a workpiece, has been carried in (S702: N), the regular process is performed (S703). On the other hand, when it is judged that the measuring tool 300 has been carried in (S702: Y), it is further judged whether or not the type of the carried-in measuring tool 300 matches the ACF crimping apparatus 101 (S704).

In the case where the measuring tool 300 is not the measuring tool 300 for the ACF pressing head 111(S704: N), subsequent processes are skipped (S709).

On the other hand, in the case where the measuring tool 300 is the measuring tool 300 for the ACF pressing head 111 (S704: Y), the mode change unit 134 changes the mode of ACF crimping apparatus into a temperature measurement (or pressure measurement) support mode (S705). With this, the drawing out of new ACF tape 201 and the double crimping of the ACF tape 201 on top of the measuring tool 300 can be prevented, and the measurement of temperature (or pressure) of the pressed part in the original condition becomes possible.

Next, the measuring tool 300 is positioned by the positioning unit 132 (S706). As with the glass board 200 as the workpiece, the positioning is performed precisely based on the mark put on the measuring tool 300. Therefore, the thermocouple 302, which is placed on the measuring tool 300, can be precisely placed at a desired position and the temperature of a desired pressed part can be precisely measured.

Next, the measurement support unit 133 supports temperature measurement by the measuring tool 300 by controlling the ACF pressing head 111, as in the regular ACF tape 201 crimping, and causing the ACF pressing head 111 to press the ACF tape 201 included in the measuring tool 300 (or its dummy) and the measuring board 301 with a predetermined pressure for a predetermined time (S707).

Here, the thermocouple 302 included in the measuring tool 300 is placed between the ACF tape 201 and the measuring board 301 in the pressed part, and thus it is possible to directly measure the temperature of the ACF tape 201 which is heated by the pressing of the heated ACF pressing head 111. Moreover, since the temperature is measured in nearly the same condition as in regular manufacturing conditions, it is also possible to precisely detect the atmosphere heated by another apparatus (for example, a motor) as well as the influence of the heat accumulated in a backup stage 142 (see FIG. 6) and so on.

Next, the in-line mounter 100 acquires measurement information from the measuring tool 300 (S708). The communication method for acquiring the measurement information is not specifically limited, although it is preferable to acquire the information by wireless communication using the wireless I/F included in the measuring tool 300 since this does not require connecting the in-line mounter 100 and the measuring tool 300.

As described above, the ACF crimping apparatus 101 can support the temperature measurement performed by the measuring tool 300 on the part pressed by the ACF pressing head 111.

In addition, although the processing operation of the ACF crimping apparatus 101 has been described above, the processing operation is the same for the temporary crimping apparatus 102, the lateral permanent crimping apparatus 103, and the longitudinal permanent crimping apparatus 104. However, in judging whether or not the measuring tool 300 has been carried in (S702) and judging whether or not it is an appropriate measuring tool (S704), each crimping apparatus (102 to 104) may judge by independently reading the barcode attached to the measuring tool 300 or judge by receiving information from the ACF crimping apparatus 101 or the like located upstream.

In addition, for the mode changing (S705) in the temporary crimping apparatus 102, it is possible to exemplify the situation in which the process of mounting the electronic component 202 onto the measuring tool 300 is not performed.

Second Embodiment

Next, another embodiment according to the present invention will be described. Note that the second embodiment is nearly the same as the first embodiment described earlier, and therefore only the part which is different from the first embodiment will be described.

Figure 8:
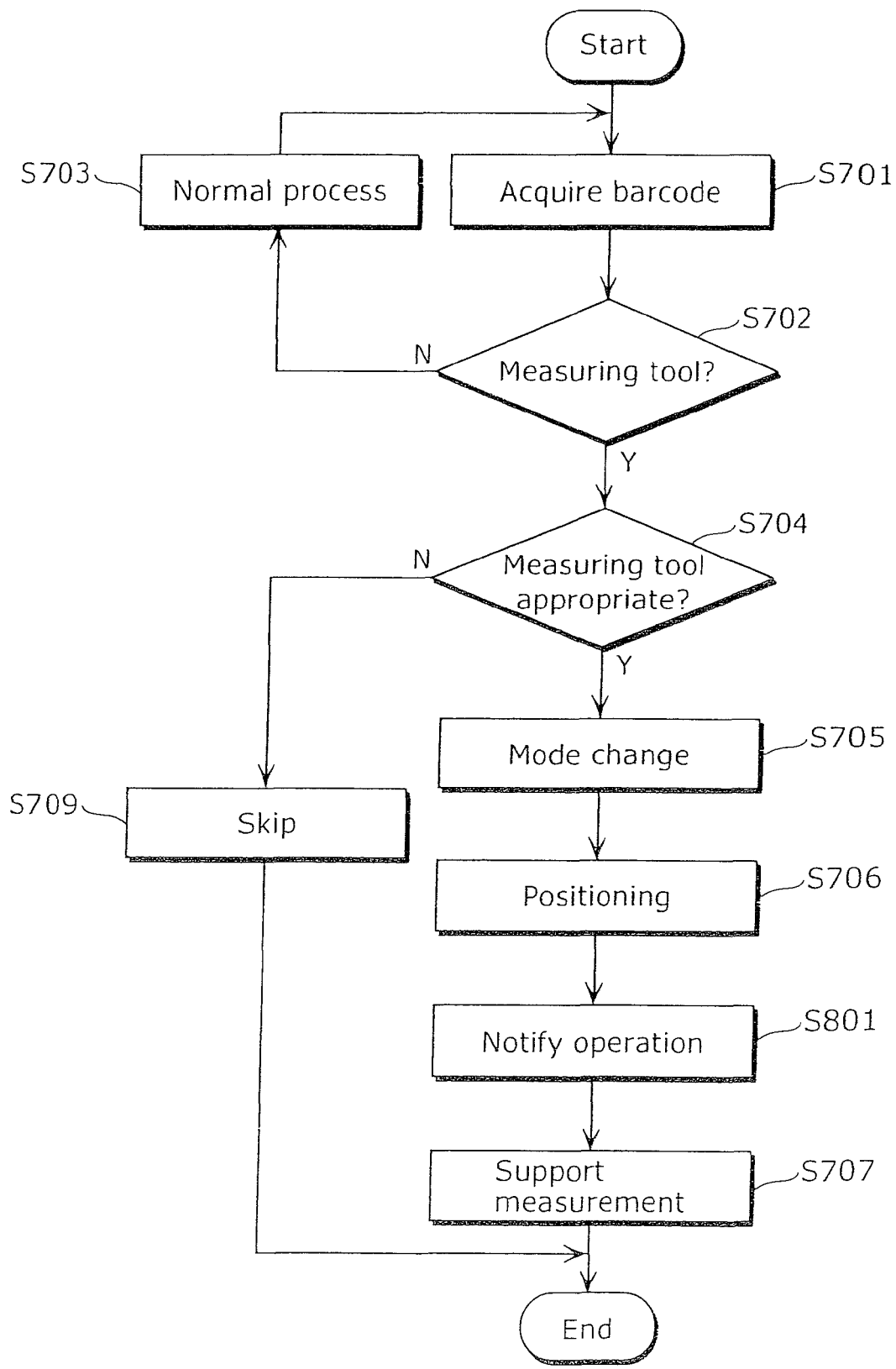
FIG. 8 is a flowchart showing the control operation according to the second embodiment.

FIG. 8 is a flowchart showing the temperature measurement or pressure measurement support processing operation performed by the in-line mounter 100 according to the second embodiment.

As for the respective steps shown in the figure, the same numerical reference is given to a step which is the same as a step in the first embodiment, and its description will be omitted. Note that the point of difference from the first embodiment is that an operation notification step (S801) is added and that the measurement information acquiring step (S708) is deleted.

When positioning of the measuring tool 300 (S706) is finished, the in-line mounter 100 gives notice of information prompting the performance of an operation related to temperature measurement or pressure measurement should be performed. Specifically, merely the sounding of a buzzer or the emitting of a light is sufficient. Alternately, a display apparatus which displays detailed information is also acceptable.

Then, upon recognition of the notice, an operator connects a cable extending from an apparatus which can acquire measurement information to the wired I/F 315 included in the measuring tool 300.

Upon acquiring information that preparation for temperature measurement or pressure measurement is completed, the in-line mounter 100 executes the measurement support step (S707).

With this, it is possible to acquire the measurement information about the pressed part from the measuring tool 300. Although the present invention has been described thus far by taking the above-mentioned embodiment as examples, the present invention is not limited to the above-mentioned embodiment.

For example, although the measuring tool 300 includes a measuring apparatus 310, and the measuring apparatus 310 performs centralized management of the information from the plural thermocouples 302, the present invention is not limited to this. For example, it is also possible to use a measuring tool 300 which does not include the measuring apparatus 310. In this case, it is only necessary to directly connect a measuring device and so on to each thermocouple 302.

In addition, although the case has been described where the measuring tool 300 is carried down from upstream, it is also acceptable to forcibly place the measuring tool 300 on the table 123 manually.

In addition, although the case has been described where the acquisition of measurement information is executed during the time when the measuring tool 300 is present in the in-line mounter 100, it is also possible to have the holding unit 313 store point-by-point temperature history and acquire this measurement information in a phase after the measuring tool 300 has been carried out of the in-line mounter 100.

(Feedback)

Next, examples of the use of the measured measurement information will be described.

For example, by acquiring measurement information by introducing the measuring tool 300 every time a predetermined number of glass boards 200 as workpiece are processed (for example, for every 1000 boards processed) and comparing the measurement information with the preceding and subsequent measurement information, this measurement information can serve as an index for guaranteeing the crimping condition of each product manufactured during that span of time when the temperature change is within the tolerance value.

In addition, it is possible to collect temperature profiles such as that of the ACF tape 201 at the time of crimping.

Figure 9:
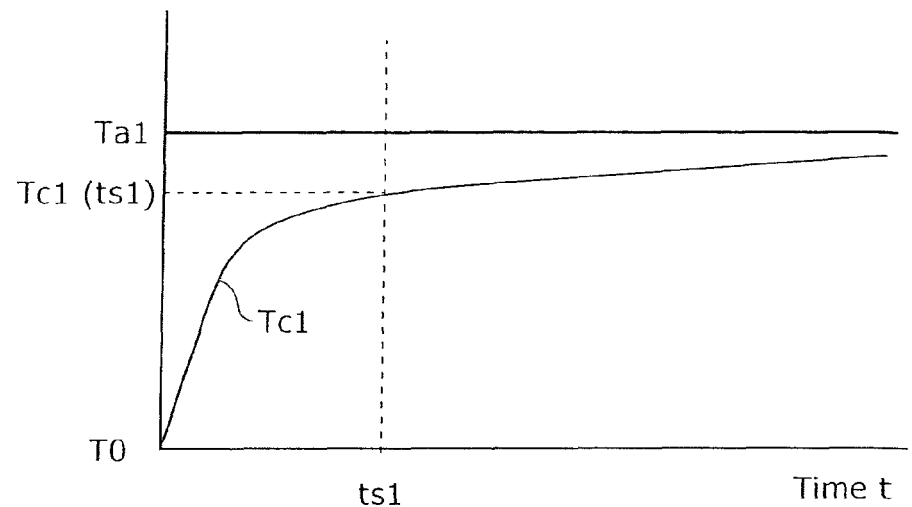
FIG. 9 is a temperature rise graph for the ACF tape measured by the measuring tool.

FIG. 9 is a temperature rise graph for the ACF tape measured by the measuring tool.

The condition for acquiring the measurement information is: the pressing head temperature is set to Ta1, and without setting any pressing time, the same pressure as in actual operation is applied until the temperature of the ACF tape becomes approximately constant. Note that the pressing time in actual operation is ts1.

As shown by the temperature rise curve Tc1 for the ACF tape in the figure, when the temperature of the pressing head is set to Ta1, the ACF tape does not attain Ta1 regardless of the time. Furthermore, it is observed that the pressing time in actual operation ts1 is considerably different from the set temperature Ta1. Note that the thermocouple is embedded inside the pressing head, and that the set temperature Ta1 and the actual temperature of the pressing head are nearly equal.

With the present invention, the above information can be easily obtained.

Figure 10:
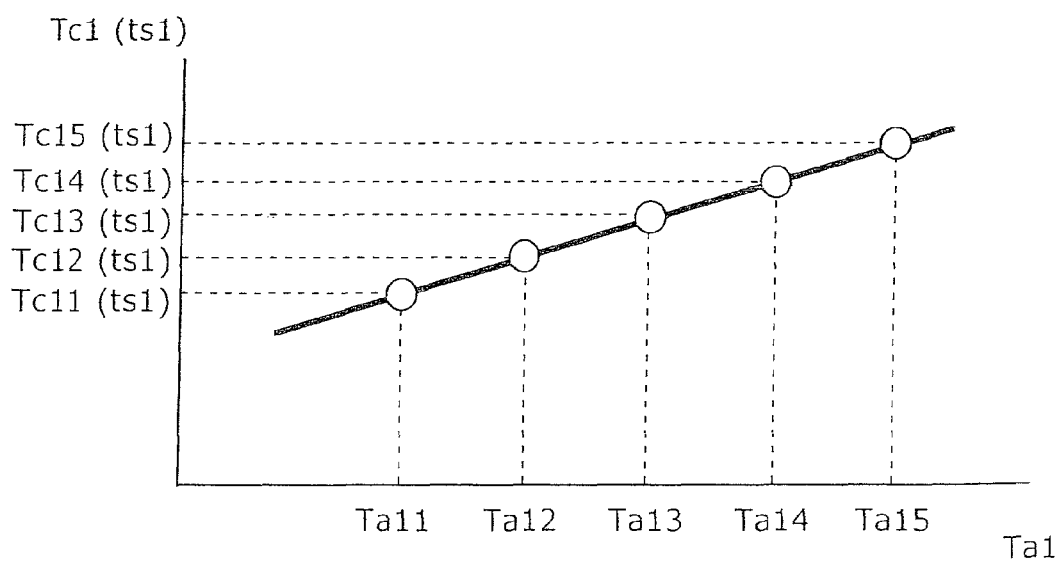
FIG. 10 is a graph showing the relation between the pressing head preset temperature and the ACF tape temperature.

FIG. 10 is a graph showing the relation between the preset temperature of the pressing head and the temperature of the ACF tape when the pressing time is at the point ts1.

The graph is obtained by measuring the temperature of the ACF tape using the measuring tool after the temperature of the pressing head is raised to the set temperature, and performing this on each set temperature of the pressing head.

With the present invention, the above information can be easily obtained.

As shown in the figure, the relation between the set temperature of the pressing head and the temperature of the ACF tape can be expressed as being an almost linear function. Therefore, it is easy to know the temperature to which the set temperature Ta1 of the pressing head should be set in order to raise the temperature of the ACF tape to the set temperature required at the time of actual operation (the temperature recommended by the ACF tape manufacturer).

In addition, by acquiring and accumulating measurement information by causing the measuring tool 300 to execute temperature measurement or pressure measurement at a predetermined interval (for example, for every predetermined period, predetermined number of processed boards, lot, and so on), it is possible to find out a correlation between the measurement information and the life of a heater included in the pressing head and to predict the life of the heater from the changing trend in the change in the accumulated measurement information.

With this, it is possible to continue using the heater until just before the end of its useful life, and extend the period for stopping operation to replace the heater. Thus, it is possible to decrease the operating cost for the crimping apparatus as well as being able to save resources.

Next, another mode of the measuring tool 300 will be described.

Figure 11:
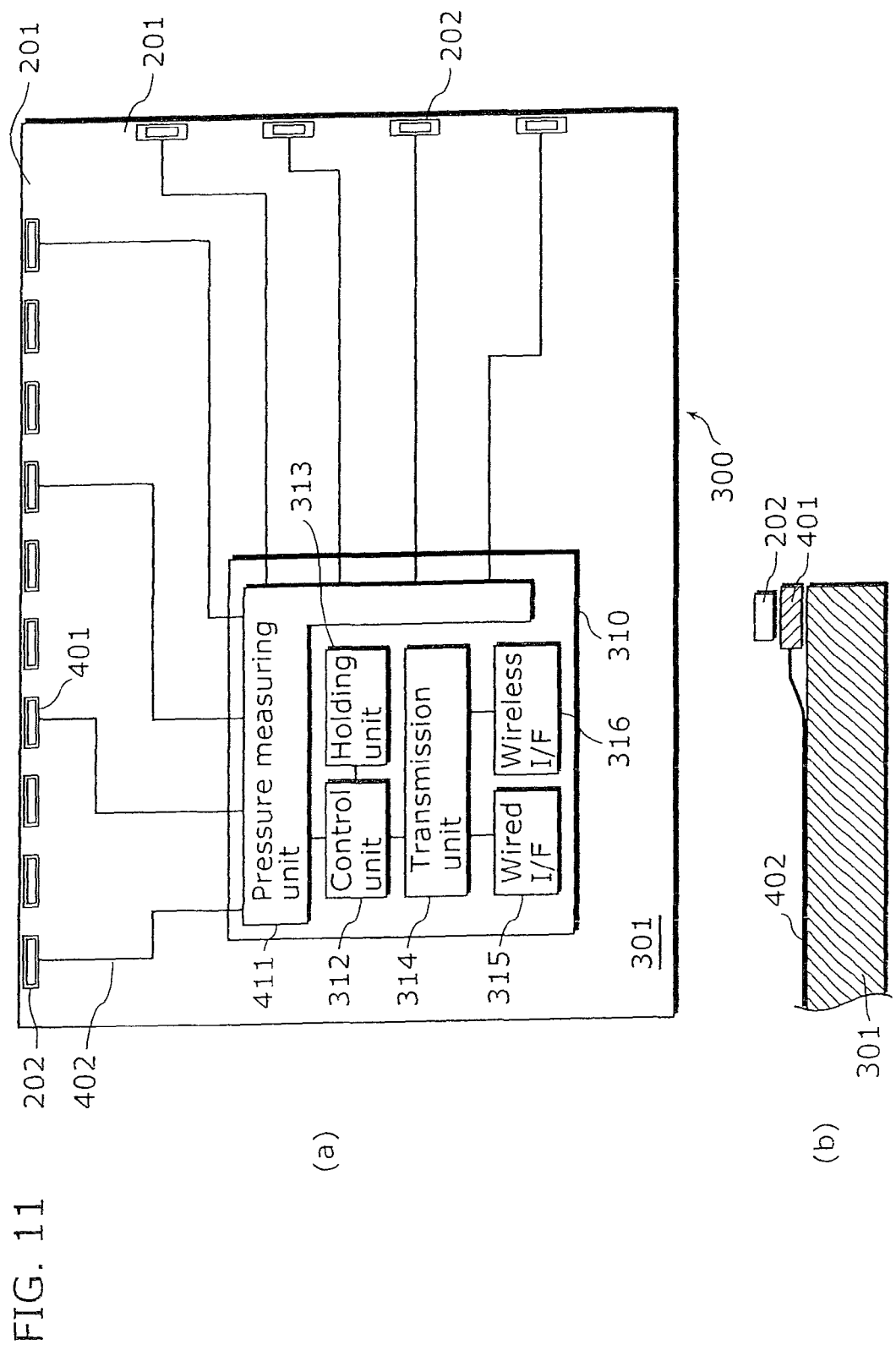
FIG. 11 is a diagram schematically showing another embodiment of the measuring tool: (a) is a diagram view and (b) is a cross-sectional view showing close-up the part of which temperature is measured.

FIG. 11 is a diagram schematically showing another embodiment of the measuring tool: (a) is a plan view and (b) is a cross-sectional view showing, close-up, the part of which pressure is measured.

The measuring tool 300 as shown in the figure is a measuring tool that can be commonly used for the temporary crimping apparatus 101, the lateral permanent crimping apparatus 103, and the longitudinal permanent crimping apparatus 104. The measuring tool 300 is an instrument which measures the pressure distribution during the pressing by the temporary pressing head 112, the lateral permanent pressing head 113, and the longitudinal permanent pressing head 114.

In addition, this measuring tool 300 includes a measuring board 301, plural pressure sensors 401, a signal cable 402, and a measuring apparatus 310. Furthermore, an electronic component 202, which is identical to the electronic component 202 to be mounted onto the glass board 200, is attached to a pressure sensor 401.

The pressure sensor 401 is a sensor which includes a matrix of elements capable of detecting pressure, and which can detect the distribution of the applied pressure. The pressure sensor 401 is set to an approximately identical thickness as the ACF tape 201, and is attached in positions at which the ACF tape 201 should be attached.

The signal cable 402 is a group of conductors for transmitting a pressure signal detected by the pressure sensor 401 to the measuring apparatus.

A pressure measuring unit 411 is a unit which converts an electrical signal outputted by the pressure sensor 401 into measurement information, and associates the measurement information with identification information, identifying the pressure sensor 401 itself and each of the elements included in the pressure sensor 401. In addition, the measurement information and the associated identification information are transmitted to the control unit.

Since other structures are the same as the previously described measuring tool 300, description will be omitted.

Note that the measuring tool 300 may be such that the temperature sensor and the pressure sensor are included at the same time in a single electronic component 202, enabling the concurrent measurement of temperature and pressure.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a component crimping apparatus, and particularly to a component crimping apparatus which attaches using ACF tape, and electrically connects an electronic component to a flat panel.

The invention claimed is:

1. A component crimping apparatus control method for controlling a component crimping apparatus in order to cause a measuring tool to measure a temperature or a pressure of a pressed part in a pressing process of pressing a component onto a plate-shaped workpiece, using a heated pressing head, in the component crimping apparatus which crimps the component onto the workpiece, the measuring tool being a measuring board which is shaped identically as the workpiece and to which a component and a temperature probe or a pressure probe are provided, said method comprising:

acquiring information indicating whether or not the measuring tool is held in the component crimping apparatus;

positioning the measuring tool identically as the workpiece in a case where the information indicating that the measuring tool is held is acquired; and executing the pressing process on the component to be provided to the measuring tool, after said positioning.

2. The component crimping apparatus control method according to claim 1, further comprising changing a mode of the component crimping apparatus into a temperature measurement support mode or a pressure measurement support mode in the case where the information indicating that the measuring tool is held is acquired, the temperature measurement support mode or the pressure measurement support mode being a state for causing the measuring tool to measure the temperature or the pressure, respectively.

3. The component crimping apparatus control method according to claim 2, wherein in the temperature measurement support mode or the pressure measurement support mode, the component to be crimped onto the workpiece is not supplied to the measuring tool.

4. The component crimping apparatus control method according to claim 2, wherein in said acquiring of information indicating whether or not the measuring tool is held, information about a type of the measuring tool is acquired, and said method further comprises skipping said positioning and said executing in the case where the acquired information about the type of the measuring tool and said component crimping apparatus do not match due to the acquired information about the type of the measuring tool indicating that the measuring tool is not an appropriate measuring tool that is shaped identically as the workpiece.

5. The component crimping apparatus control method according to claim 1, further comprising notifying information prompting performance of an operation related to temperature measurement or pressure measurement before a start of said executing.

6. The component crimping apparatus control method according to claim 1, further comprising acquiring information regarding temperature or pressure from the measuring tool.

7. A component crimping apparatus which includes a pressing head and which crimps a component onto a plate-shaped workpiece using the pressing head which, in a heated state, presses the component onto the workpiece, said component crimping apparatus comprising:

a measuring tool information acquiring unit operable to acquire information indicating whether or not a measuring tool is held, the measuring tool being shaped identically as the workpiece and measuring a temperature of a part pressed by the pressing head or a pressure at a time of crimping;

a positioning unit operable to position the measuring tool identically as the workpiece in a case where the information indicating that the measuring tool is held is acquired; and a measurement support unit operable to press the measuring tool using the pressing head, after the positioning.

8. The component crimping apparatus according to claim 7, wherein said measuring tool information acquiring unit acquires the information about a type of the measuring tool, and said component crimping apparatus further comprises a mode change unit operable, in the case where the information indicating that the measuring tool is held is acquired, to change a mode of said component crimping apparatus into a measurement support mode which is a state for causing a measuring tool to measure the temperature or the pressure.

9. A program for controlling a component crimping apparatus in order to cause a measuring tool to measure a temperature or a pressure of a pressed part in a pressing process of pressing a component onto a plate-shaped workpiece, using a pressing head in a heated state, in the component crimping apparatus which crimps the component onto the workpiece, the measuring tool being a measuring board which is shaped identically as the workpiece and to which a component and a temperature probe or a pressure probe are provided, said program causing a computer to execute:

acquiring information indicating whether or not the measuring tool is held in the component crimping apparatus;

positioning the measuring tool identically as the workpiece in a case where the information indicating that the measuring tool is held is acquired; and executing the pressing process on the component to be provided to the measuring tool, after said positioning.

10. A measuring tool applied to a component crimping apparatus which crimps a component onto a plate-shaped workpiece, and which measures a temperature of a pressed part in a pressing process of pressing the component onto the workpiece using a pressing head in a heated state included in the component crimping apparatus, said measuring tool comprising:

a board shaped identically as the workpiece;

a component to be provided to said board in an identical position as the workpiece; and a temperature probe or a pressure probe provided so as to be in contact with the workpiece.

11. The measuring tool according to claim 10, further comprising a holding unit operable to hold identification information and measurement information in association with each other, the identification information identifying the temperature probe or the pressure probe, and measurement information being acquired from the temperature probe or the pressure probe.

12. The measuring tool according to claim 11, further comprising a transmitting unit operable to transmit the identification information and the measurement information.

* * * * *